(12) United States Patent
Li et al.

(10) Patent No.: US 8,517,481 B2
(45) Date of Patent: Aug. 27, 2013

(54) ENCLOSURE WITH REMOVABLE PANEL

(75) Inventors: Zhi-Xin Li, Shenzhen (CN); Jun-Xiong Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 116 days.

(21) Appl. No.: 13/169,044

(22) Filed: Jun. 27, 2011

(65) Prior Publication Data
US 2012/0299455 A1    Nov. 29, 2012

(30) Foreign Application Priority Data

May 24, 2011    (CN) .......................... 2011 1 0135325

(51) Int. Cl.
  *A47B 88/00*    (2006.01)
(52) U.S. Cl.
  USPC ........................... 312/329; 312/223.2; 16/335
(58) Field of Classification Search
  USPC ............... 312/257.1, 326, 329, 223.2, 265.5, 312/265.6, 334.44–334.47, 405; 361/679.02, 361/724, 725, 679.6; 16/257, 260, 261, 266, 16/331, 335; 49/398, 399; 248/288.11, 289.11, 248/289.31, 290.1
  See application file for complete search history.

(56) References Cited

U.S. PATENT DOCUMENTS

| | | | | | |
|---|---|---|---|---|---|
| 1,573,231 | A | * | 2/1926 | Economides | 16/266 |
| 3,608,130 | A | * | 9/1971 | Rudnick | 16/335 |
| 3,846,005 | A | * | 11/1974 | Harper et al. | 312/248 |
| 4,125,273 | A | * | 11/1978 | Rothmayer | 280/603 |
| 4,932,101 | A | * | 6/1990 | Lualdi | 16/255 |
| 5,570,498 | A | * | 11/1996 | Hipkiss et al. | 16/258 |
| 5,784,758 | A | * | 7/1998 | Carrick | 16/335 |
| 6,226,835 | B1 | * | 5/2001 | Cress | 16/260 |
| 6,470,532 | B2 | * | 10/2002 | Rude | 16/335 |
| 6,810,562 | B1 | * | 11/2004 | Horne et al. | 16/254 |
| 7,008,032 | B2 | * | 3/2006 | Chekal et al. | 312/405 |
| 8,147,015 | B2 | * | 4/2012 | Kim et al. | 312/405 |
| 2002/0060512 | A1 | * | 5/2002 | Gan et al. | 312/329 |
| 2002/0097560 | A1 | * | 7/2002 | Carr | 361/724 |
| 2003/0223191 | A1 | * | 12/2003 | Shyr | 361/683 |
| 2004/0160149 | A1 | * | 8/2004 | Chen | 312/223.2 |
| 2007/0277347 | A1 | * | 12/2007 | Doswell et al. | 16/258 |
| 2007/0297126 | A1 | * | 12/2007 | Yang et al. | 361/683 |
| 2008/0078061 | A1 | * | 4/2008 | Hsu et al. | 16/367 |
| 2008/0271290 | A1 | * | 11/2008 | Chen et al. | 16/238 |
| 2009/0070960 | A1 | * | 3/2009 | Elliott et al. | 16/334 |
| 2009/0106940 | A1 | * | 4/2009 | Greenbank | 16/367 |
| 2009/0284916 | A1 | * | 11/2009 | Chang | 361/679.58 |
| 2010/0295428 | A1 | * | 11/2010 | Favaro et al. | 312/228 |
| 2012/0167342 | A1 | * | 7/2012 | Wu et al. | 16/239 |

* cited by examiner

*Primary Examiner* — Darnell Jayne
*Assistant Examiner* — Ryan A Doyle
(74) *Attorney, Agent, or Firm* — Altis Law Group, Inc.

(57) ABSTRACT

An enclosure includes a main body, a front panel, a pivot member pivotably attaching the front panel to the main body, and a positioning member. The pivot member is substantially U-shaped, allowing the front panel a large angle of rotational movement relative to the main body. Positioning members are in place to facilitate the refitting of the front panel.

17 Claims, 8 Drawing Sheets

ENCLOSURE WITH REMOVABLE PANEL

BACKGROUND

1. Technical Field

The present disclosure relates to enclosures and, more particularly, to an enclosure with a removable front panel.

2. Description of Related Art

To install hard disk drives in an electronic device, such as a server, a front panel of an enclosure of the server needs to be opened. However, the open angle of the front panel generally is often limited, which is inconvenient for installing or uninstalling the hard disk drives.

BRIEF DESCRIPTION OF THE DRAWINGS

Many aspects of the present embodiments can be better understood with reference to the following drawing. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Figure 1:
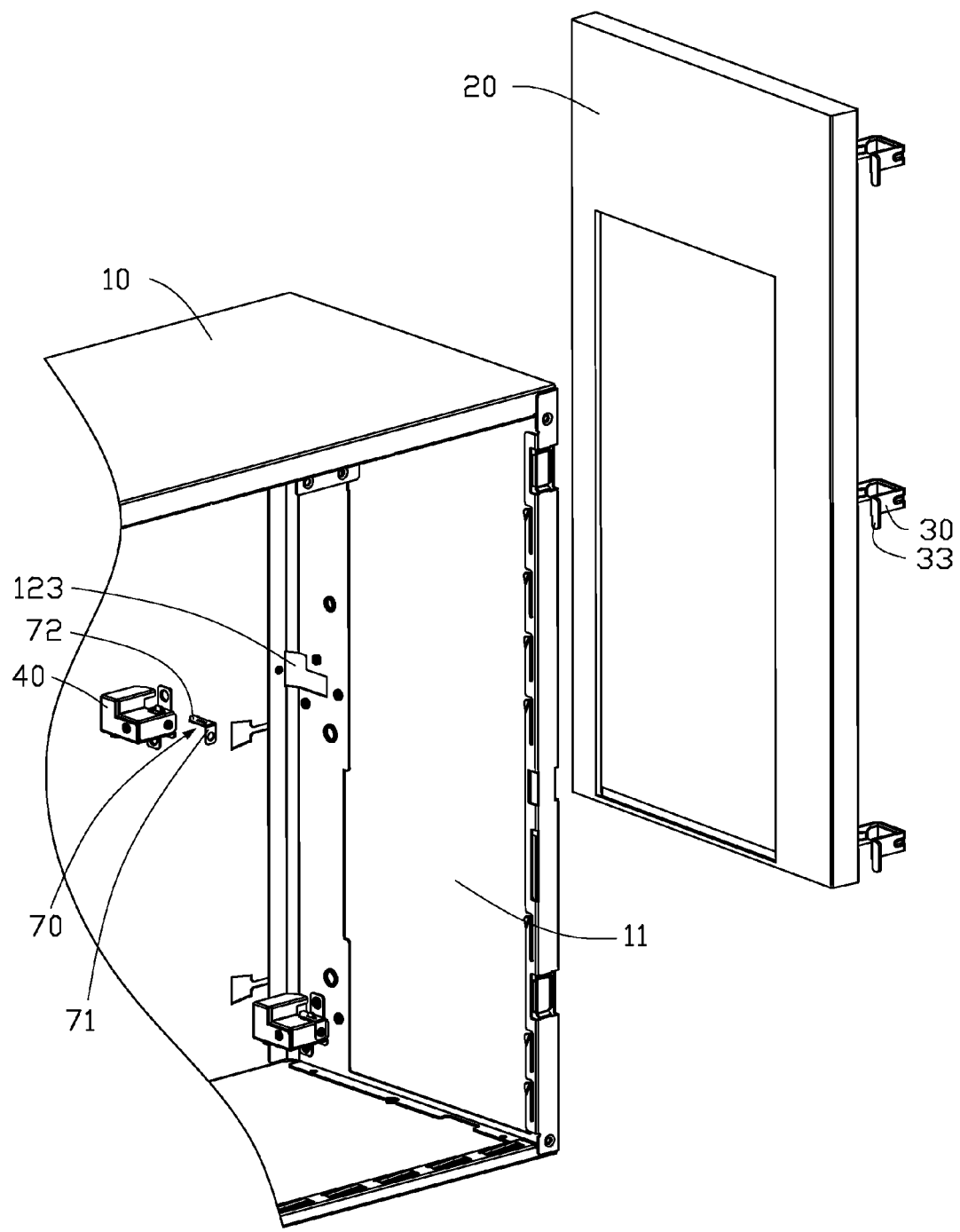
FIG. 1 is an exploded, isometric view of an embodiment of an enclosure, the enclosure includes a main body, a front panel, a plurality of pivot members, a plurality of mounting members, and a plurality of positioning members.
Figure 2:
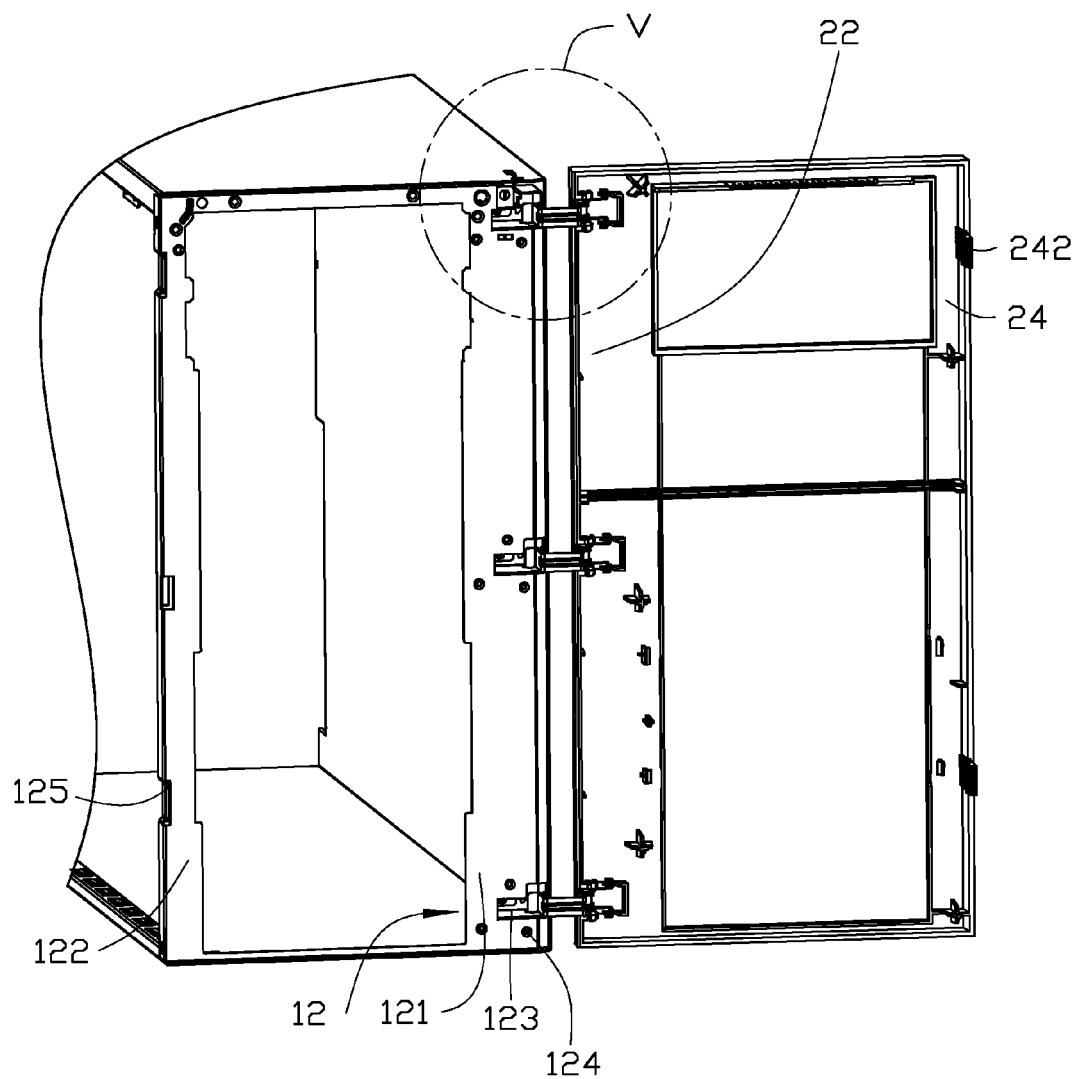
FIG. 2 is an assembled, isometric view of the enclosure of FIG. 1.
Figure 3:
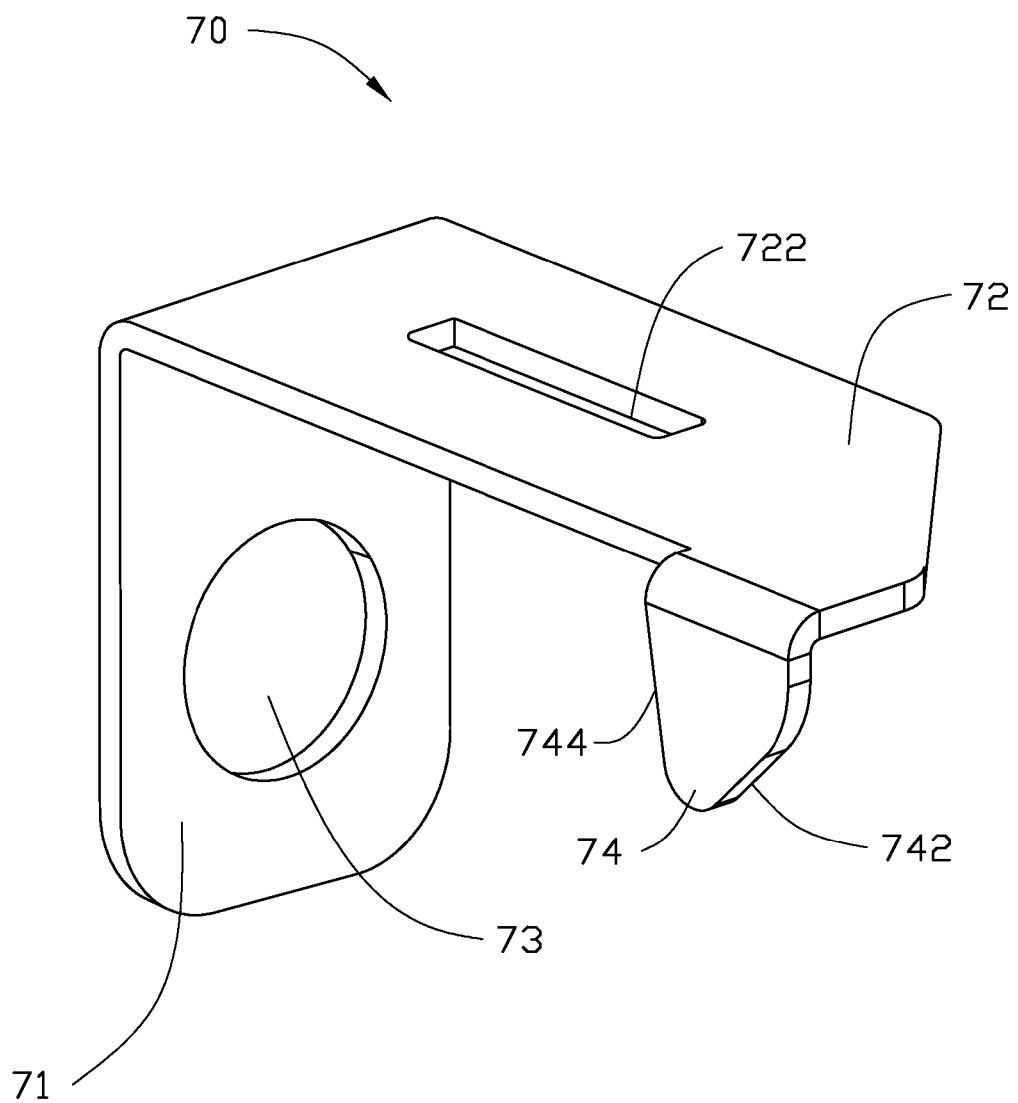
FIG. 3 is an enlarged view of one of the positioning members of FIG. 1, but shows another perspective.

Referring to FIG. 1 to FIG. 3, an exemplary embodiment of an enclosure of an electronic device, such as a server, includes a main body 10, a front panel 20, three pivot members 30, three mounting members 40, three shafts 50 (shown in FIG. 5), three resilient members 60 (shown in FIG. 5), and three positioning members 70.

The main body 10 is substantially box-shaped to enclose a motherboard, a plurality of hard disk drives, a plurality of fans, and other functioning elements (all not shown in the drawings). The main body 10 includes a front plate 12, an opening 11 defined in a center of the front plate 12. The front plate 12 includes a first side plate 121 and a second side plate 122 bounding the opening 11.

The first side plate 121 defines three substantially L-shaped through holes 123 from top to bottom and away from the opening 11. Two mounting holes 124 are also defined in the first side plate 121, respectively above and below each through hole 123.

Two locking portions 125 are formed on the second side plate 122, towards the top and bottom of it respectively, and opposite to the first side plate 121.

Figure 5:
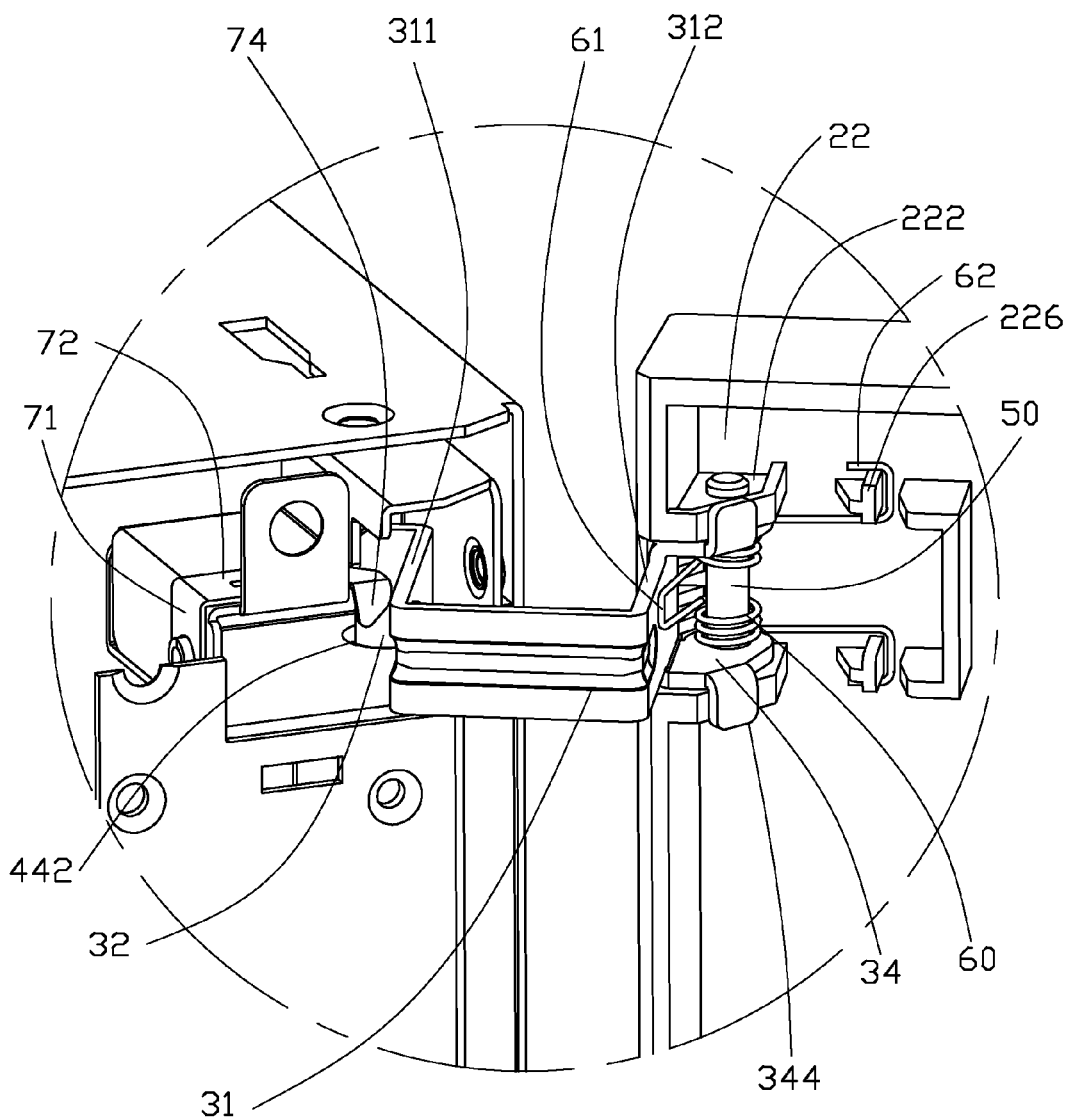
FIG. 5 to FIG. 8 are enlarged views of a circled portion V of FIG. 2, but showing different states of use.
Figure 6:
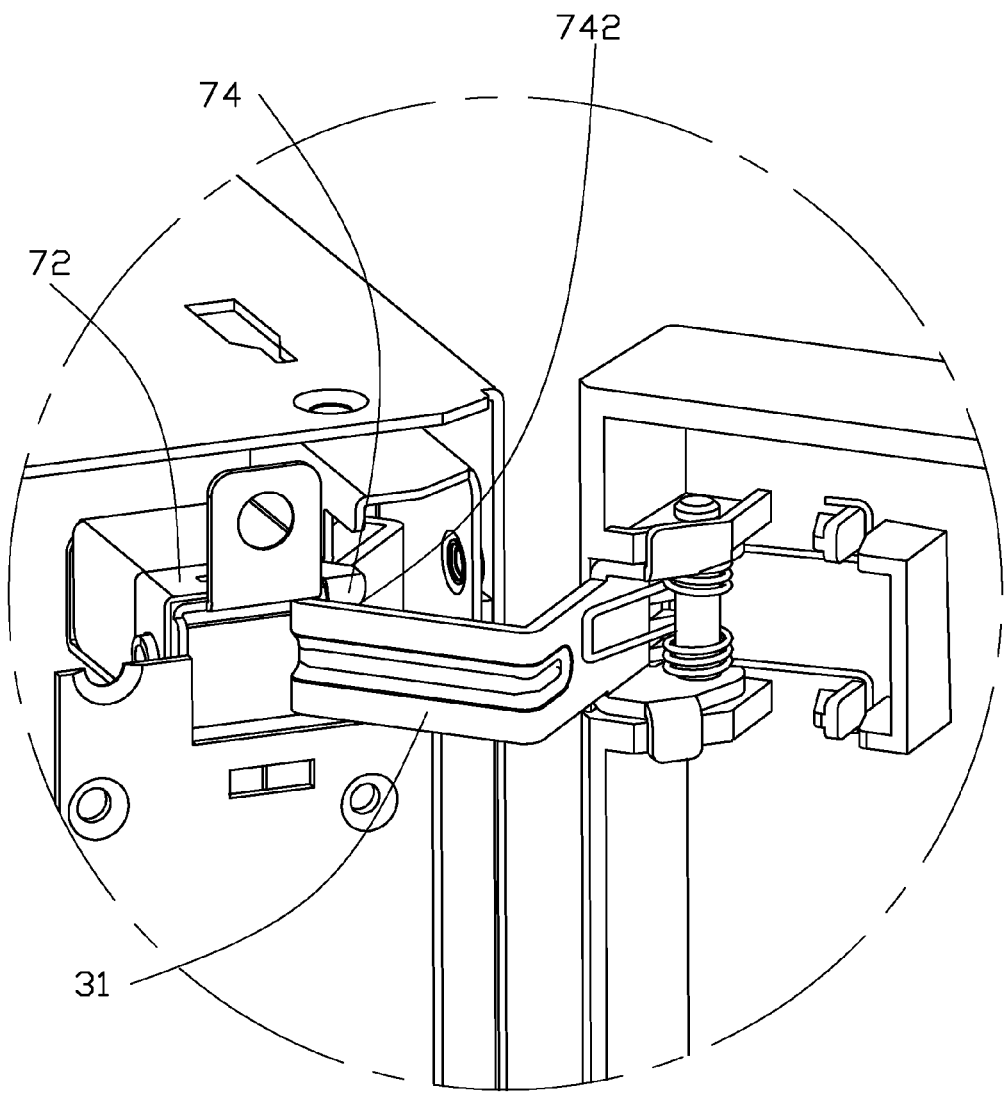
Figure 7:
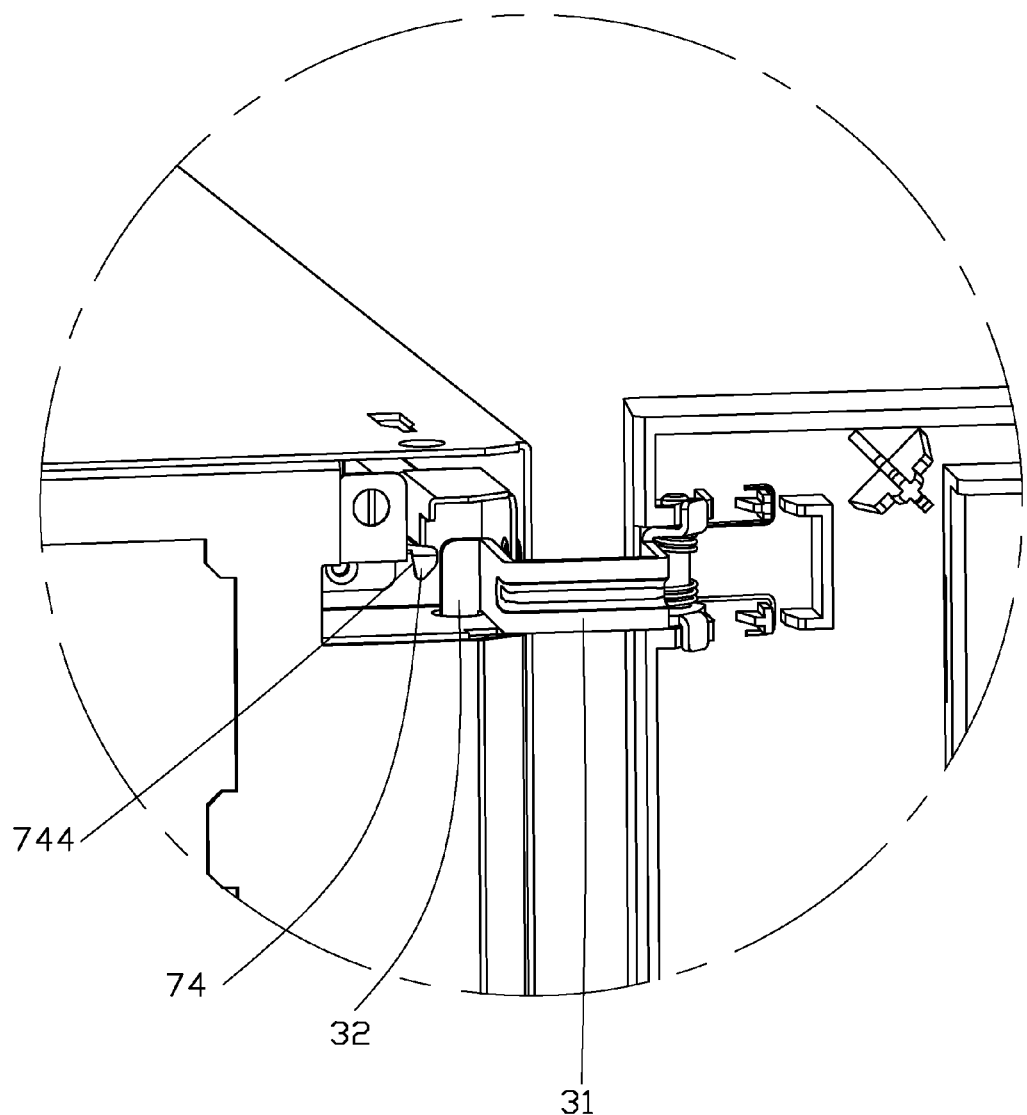
Figure 8:
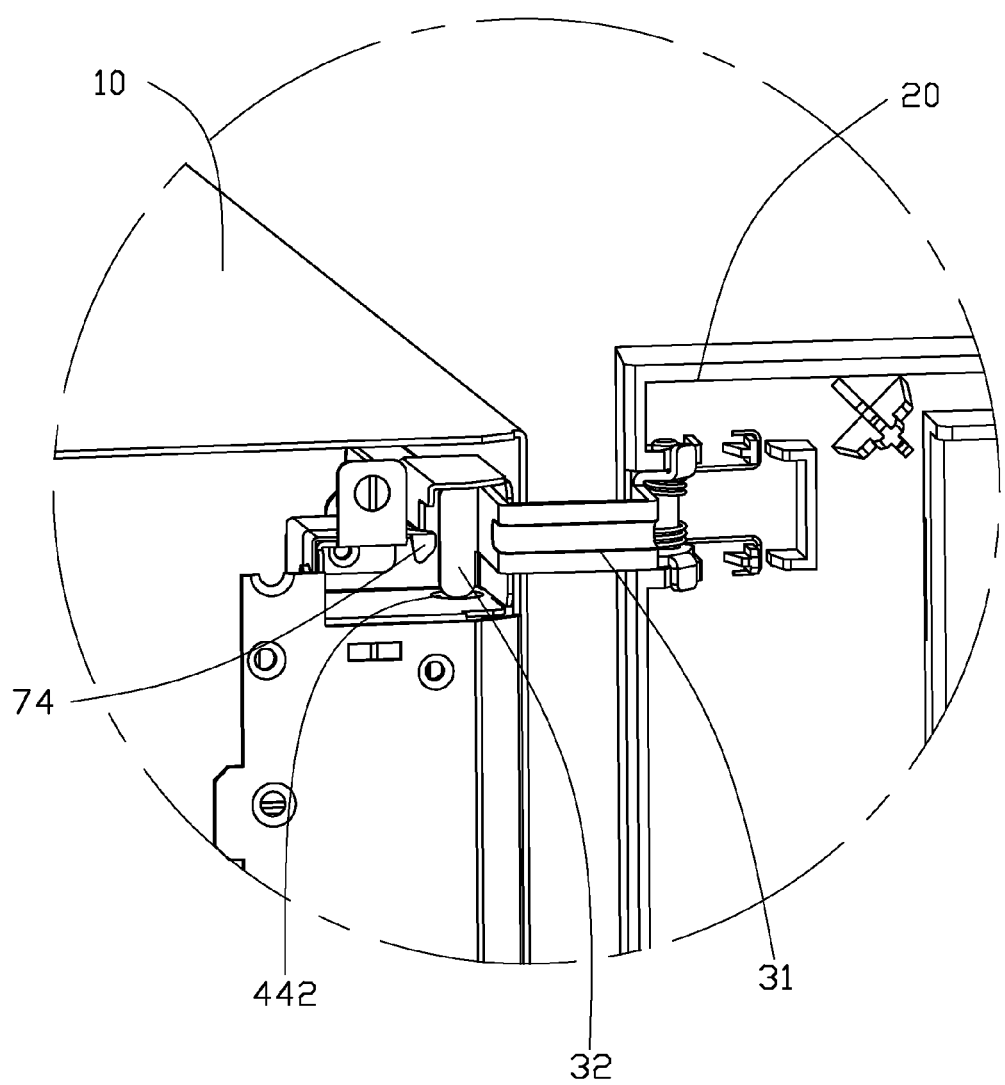

Referring to FIG. 5, the front panel 20 includes a pivot side 22, and a locking side 24 opposite to the pivot side 22. Two parallel pivot portions 222 are formed on the pivot side 22, corresponding to each through hole 123. A pivot hole (not labeled) is defined in each pivot portion 222. A rod 226 protrudes from the pivot side 22, adjacent to each pivot portion 222. Two spaced hooks 242 are formed from the locking side 24.

Referring to FIG. 1 and FIG. 5, each pivot member 30 includes a substantially U-shaped base 31. The base 31 includes a first portion 311 and a second portion 312 spaced from and opposite to the first portion 311. An inserting portion 32 substantially perpendicular extends from the distal end of the first portion 311. A pin 33 extends down from the bottom of the inserting portion 32. Two parallel connecting portions 34 extend in a substantially perpendicular manner from the distal end of the second portion 312. Each connecting portion 34 defines a connecting hole (not labeled). A tab 344 extends at right angles from the side of each connecting portion 34, such that the two tabs 344 are coplanar and at the greatest possible distance from each other.

Figure 4:
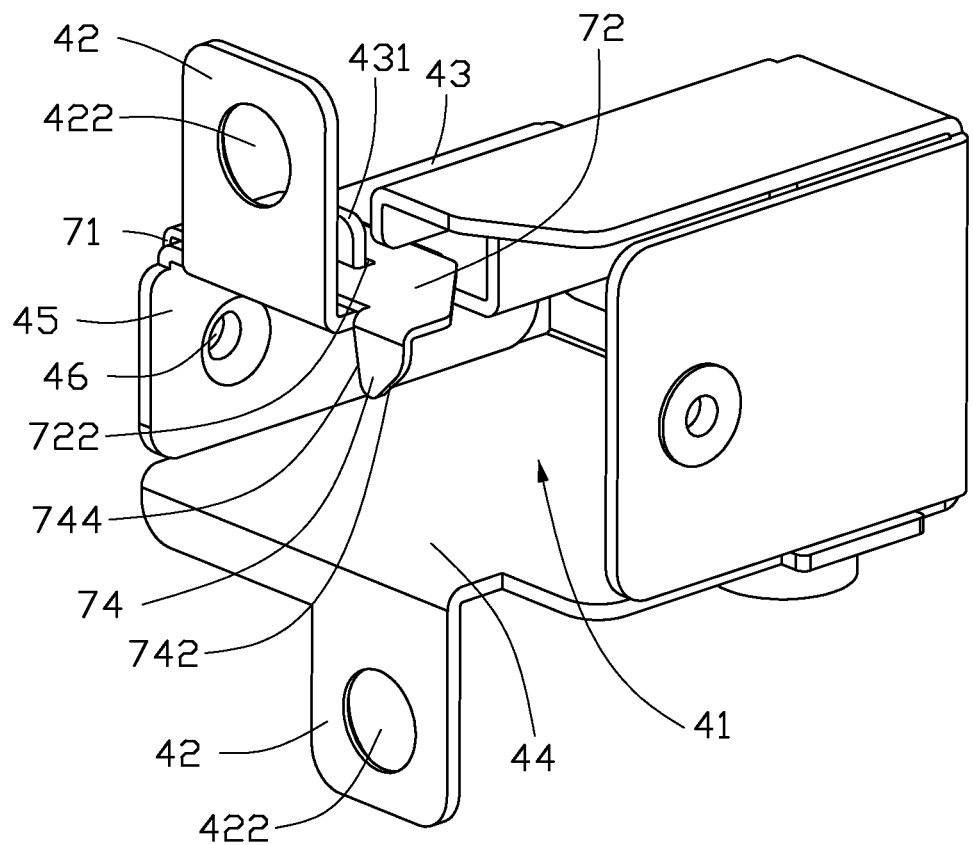
FIG. 4 is an assembled view of one of the mounting member and a corresponding positioning member of FIG. 1, but shows another perspective.

Referring to FIG. 1, FIG. 4, and FIG. 5, each mounting member 40 is a substantially L-shaped box and defines an L-shaped receiving space 41. Two mounting pieces 42 are formed from the mounting member 40 beside the receiving space 41. A mounting hole 422 is defined in each mounting piece 42. The mounting member 40 includes an L-shaped top wall 43, a bottom wall 44, and a sidewall 45 defining a mounting hole 46 and connecting the top wall 43 and the bottom wall 44. The mounting pieces 42 extend from the top wall 43 and the bottom wall 44, respectively. The mounting member 40 defines a pivot hole 442 in the bottom wall 44, communicating with the receiving space 41. A mounting piece 431 extends up from the top wall 43.

In this embodiment, each resilient member 60 is a torsion spring and includes an engaging portion 61 extending out from the middle of the spring, and two fingers 62 at opposite ends of the resilient member 60.

Referring to FIG. 3, each positioning member 70 is a substantially L-shaped piece, and includes a fixing piece 71 defining a mounting hole 73, and a resilient piece 72 substantially perpendicular extending from one end of the fixing piece 71. A longitudinal through slot 722 is defined in the middle of the resilient piece 72. A positioning piece 74 extends down in a substantially perpendicular manner from the distal end of a side of the resilient piece 72, opposite to and perpendicular to the fixing piece 71. The positioning piece 74 is substantially triangular and includes a first slope 742 opposite to the fixing piece 71, and a second slope 744 opposite to the first slope 742 and facing the fixing piece 71.

Referring to FIG. 5 to FIG. 8, in assembly, the front panel 20 is pivotably mounted to the main body 10 using the pivot members 30. The assembly process of only one of the pivot members 30 is described as an example. The fixing piece 71 is fixed to an outer surface of the sidewall 45 of the mounting member 40 by a screw (not shown) extending through the mounting hole 73 of the fixing piece 71 to engage in the mounting hole 46 of the sidewall 45. The resilient piece 72 resists against the outer surface of a low portion of the top wall 43. The mounting piece 431 extends through the through slot 722. The mounting member 40 is fixed to the inner surface of the front plate 12, by two screws (not shown) which extend through the mounting holes 422 of the mounting pieces 42 to engage in the first side plate 121. The receiving space 41 aligns with the through hole 123. The connecting portions 34 of the pivot member 30 are arranged between the pivot portions 222. The connecting holes of the connecting portions 34 align with the corresponding pivot holes of the pivot portions 222. The shaft 50 extends through one of the pivot holes, the connecting holes, and the other pivot hole. The resilient members 60 are arranged between the connecting portions 34 and set around the shaft 50. The engaging portion 61 resists against the base 31. The fingers 62 resist against the front panel 20 and are held in place by the rods 226. The inserting portion 32 extends through the receiving space 41 and the pin 33 is pivotably inserted in the pivot hole 442.

To close the front panel 20 relative to the main body 10, thereby covering the opening 11, the front panel 20 is pivoted. The locking side 24 of the front panel 20 moves towards the front plate 12 of the main body 10, and the pin 33 is rotated in the pivot hole 442. The first portion 311 of the pivot member 30 resists against the first slope 742 of the positioning member 70 and deforms the resilient piece 72, thereby raising the positioning piece 74. After the base 31 passes over the positioning piece 74, the resilient piece 72 restores itself by moving down the positioning piece 74 between the first portion 311 and the second portion 312. The positioning piece 74 resists against an inner surface of the first portion 311 to position the base 31. The hooks 242 latch the locking portions 125.

To release the front panel 20 relative to the main body 10, the front panel 20 is pivoted. The hooks 242 are disengaged from the locking portions 125. The locking side 24 of the front panel 20 moves away from the front plate 12 of the main body 10, and the pin 33 rotates in the pivot hole 442. The first portion 311 resists against the second slope 744 to deform the resilient piece 72, thereby raising the positioning piece 74. After the base 31 passes over the positioning piece 74, the front panel 20 rises up to release the inserting portion 32 from the pivot hole 442, allowing the removal of the front panel 20 from the main body 10.

In this embodiment, the pivot members 30 are substantially U-shaped to allow a large angle of rotation by the front panel 20 relative to the main body 10. The positioning members 70 limit the front panel 20 and perform a necessary function in the assembly or disassembly of the front panel 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure comprising:
   a main body;
   a front panel comprising a pivot side;
   a mounting member fixed to the main body, and defining a pivot hole;
   a pivot member comprising a substantially U-shaped base, the base comprising a first portion and a second portion opposite to the first portion, wherein an inserting portion is formed from the first portion of the base, and a pin extends from the inserting portion, the second portion is pivotably mounted to the pivot side of the front panel, the pin is pivotably inserted in the pivot hole of the mounting member; and
   a positioning member fixed to the mounting member, the positioning member comprising a positioning piece to resist against the first portion of the base;
   wherein the positioning member is a substantially L-shaped piece, and comprises a fixing piece fixed to a sidewall of the mounting member, and a resilient piece extending from the fixing piece, a through slot is defined in the resilient piece, a mounting piece extends up from a top of the mounting member and extends through the through slot, and the positioning piece extends down from a distal end of the resilient piece.

2. The enclosure of claim 1, wherein the main body defines an opening, the mounting member is located at a first side of the opening.

3. The enclosure of claim 2, wherein the main plate forms a locking portion at a second side of the opening, the front panel further comprises a locking side opposite to the pivot side, the pivot side of the front panel forms a hook to be locked to the locking portion, thereby the front panel covering the opening.

4. The enclosure of claim 1, wherein two connecting portions are formed from the pivot member, two pivot portions are formed from the pivot side of the front panel, the connecting portions of the pivot member are arranged between the pivot portions, a shaft pivotably extends through the pivot portions and the connecting portions.

5. The enclosure of claim 4, further comprising a resilient member arranged between the connecting portions and set around the shaft, wherein the resilient member comprises an engaging portion and two fingers, the engaging portion resists against the base of the pivot member, the fingers resist against the pivot side of the front panel.

6. The enclosure of claim 1, wherein the positioning piece is a substantially triangle and includes a first slope and a second slope opposite to the first slope.

7. The enclosure of claim 1, wherein the main body defines a through hole in the first side of the opening, the mounting member defines a receiving space aligning with the through hole, the pivot hole is defined in a bottom of the mounting member and communicates with the receiving space, the inserting portion of the pivot member extends through the receiving space, and the pin is pivotably inserted in the pivot hole of the mounting member.

8. An enclosure comprising:
   a main body comprising a front plate;
   a front panel comprising a pivot side;
   a mounting member fixed to the front plate of the main body, and defining a pivot hole;
   a pivot member comprising a base, wherein an inserting portion is formed from a first end of the base, a second end of the base is pivotably mounted to the pivot side of the front panel, a pin extends from the inserting portion, the pin is pivotably inserted in the pivot hole of the mounting member; and
   a positioning member fixed to the mounting member, the positioning member comprising a deformable resilient piece and a positioning piece extending from the resilient piece, the positioning piece comprising a first slope;
   wherein when covering the front panel to the front plate, the front panel is pivoted about the pivot side, the base resists against the first slope to deform the resilient piece up, thereby raising the positioning piece, after the base passes over the positioning piece, the resilient piece is restored to move down the positioning piece to limit the base.

9. An enclosure comprising:
   a main body;
   a front panel comprising a pivot side;
   a mounting member fixed to the main body, and defining a pivot hole;
   a pivot member comprising a substantially U-shaped base, the base comprising a first portion and a second portion opposite to the first portion, wherein an inserting portion is formed from the first portion of the base, a pin extends from the inserting portion, the second portion is pivotably mounted to the pivot side of the front panel, the pin is pivotably inserted in the pivot hole of the mounting member; and a positioning member fixed to the mounting member, the positioning member comprising a deformable resilient piece and a positioning piece extending from the resilient piece, wherein the positioning piece is located between the first portion and the second portion to resist against the first portion of the base, the positioning member comprises a first slope and a second slope opposite to the first slope;

wherein when removing the front panel from the main body, the front panel is pivoted, the first portion resists against the second slope to deform the resilient piece up to raise the positioning piece, thereby the first portion passes over the positioning piece, the front panel is moved up to release the pin from the pivot hole;

wherein when covering the front panel to the main body, the first portion resists against the second slope to deform the resilient piece up to raise the positioning piece, thereby the first portion passing over the positioning piece, to resist against an inner surface of the first portion.

10. The enclosure of claim 9, wherein the main body defines an opening, the mounting member is located at a first side of the opening.

11. The enclosure of claim 10, wherein the main body forms a locking portion at a second side of the opening, the front panel further comprises a locking side opposite to the pivot side, the pivot side of the front panel forms a hook to be locked to the locking portion.

12. The enclosure of claim 9, wherein two connecting portions are formed from the pivot member, two pivot portions are formed from the front panel, the connecting portions of the pivot member are arranged between the pivot portions and pivotably connected to each other through a shaft.

13. The enclosure of claim 12, further comprising a resilient member arranged between the connecting portions and set around the shaft, wherein the resilient member comprises an engaging portion and two fingers, the engaging portion resists against the base of the pivot member, the fingers resist against the front panel.

14. The enclosure of claim 9, wherein the positioning member is a substantially L-shaped piece, and comprises a fixing piece fixed to a sidewall of the mounting member, the resilient piece extends from the fixing piece, a through slot is defined in the resilient piece, a mounting piece extends up from a top of the mounting member and extends through the through slot.

15. The enclosure of claim 9, wherein the main body defines a through hole, the mounting member defines a receiving space aligning with the through hole, the pivot hole is defined in a bottom of the mounting member and communicates with the receiving space, the inserting portion of the pivot member extends through the receiving space of the mounting member, the pin is pivotably inserted in the pivot hole of the mounting member.

16. The enclosure of claim 8, wherein the positioning member comprises a fixing piece fixed to a sidewall of the mounting member, the resilient piece extends from the fixing piece, a through slot is defined in the resilient piece, a mounting piece extends up from a top of the mounting member and extends through the through slot, the positioning piece extends down from a distal end of the resilient piece.

17. The enclosure of claim 16, wherein the positioning piece is a substantially triangle and further includes a second slope opposite to the first slope, when removing the front panel from the front plate, the front panel is pivoted, the base resists against the second slope to deform the resilient piece up to raise the positioning piece, thereby the base passes over the positioning piece, the front panel is moved up to release the pin from the pivot hole.

* * * * *